(12) United States Patent
Ota (10) Patent No.: US 12,412,763 B2
(45) Date of Patent: Sep. 9, 2025

(54) WAFER BOAT

(71) Applicant: KYOCERA Corporation, Kyoto (JP)

(72) Inventor: Shoichi Ota, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 423 days.

(21) Appl. No.: 17/798,049

(22) PCT Filed: Feb. 5, 2021

(86) PCT No.: PCT/JP2021/004416
§ 371 (c)(1),
(2) Date: Aug. 5, 2022

(87) PCT Pub. No.: WO2021/157722
PCT Pub. Date: Aug. 12, 2021

(65) Prior Publication Data
US 2023/0111655 A1   Apr. 13, 2023

(30) Foreign Application Priority Data

Feb. 7, 2020   (JP) ................................. 2020-020013

(51) Int. Cl.
*H01L 21/67* (2006.01)
*C04B 35/10* (2006.01)
(Continued)

(52) U.S. Cl.
CPC ........ *H01L 21/67316* (2013.01); *C04B 35/10* (2013.01); *C04B 35/565* (2013.01)

(58) Field of Classification Search
CPC ......... H01L 21/67316; H01L 21/67313; C04B 35/10; C04B 35/565; C04B 35/62655;
(Continued)

(56) References Cited

U.S. PATENT DOCUMENTS 3,828,726 A * 8/1974 Dietze ............... H01L 21/67115
211/41.18
3,893,869 A * 7/1975 Mayer ..................... B08B 3/12
134/184
(Continued)

FOREIGN PATENT DOCUMENTS

EP          0506052 A1    9/1992
JP       H11-126755 A    5/1990
(Continued)

OTHER PUBLICATIONS

Taiwan Patent Office; Office Action issued in Corresponding Taiwanese Patent Application No. 110104481; 20 Pages.

*Primary Examiner* — Ko H Chan
(74) *Attorney, Agent, or Firm* — Procopio, Cory, Hargreaves & Savitch LLP (57) ABSTRACT

A wafer boat according to the present disclosure includes a plurality of support columns, each having a pillar shape and comprising a plurality of grooves configured to have a wafer placed thereon, and support plates configured to support both end portions of the plurality of support columns, respectively. Each of the plurality of support columns are formed of a ceramic containing aluminum oxide or silicon (Continued)

carbide as a main constituent, and an outer side surface of the plurality of support columns is a ground surface and/or a polished surface.

11 Claims, 5 Drawing Sheets

(51) Int. Cl.
  *C04B 35/565* (2006.01)
  *H01L 21/673* (2006.01)
(58) Field of Classification Search
  CPC ............ C04B 35/62695; C04B 35/634; C04B 35/63416; C04B 35/63424; C04B 35/63476; C04B 35/63488; C04B 2235/3206; C04B 2235/3208; C04B 2235/3418; C04B 2235/3821; C04B 2235/422; C04B 2235/48; C04B 2235/5436; C04B 2235/5463; C04B 2235/5472; C04B 2235/6567; C04B 2235/658; C04B 2235/6581; C04B 2235/94; C04B 2235/945; C04B 2235/963; C04B 35/111; Y10S 206/832; Y10S 414/138; Y10S 269/903
  See application file for complete search history.

(56) References Cited

U.S. PATENT DOCUMENTS

| | | | | |
|---|---|---|---|---|
| 3,961,877 | A | * | 6/1976 | Johnson ............... C23F 1/08 206/561 |
| 4,203,940 | A | | 5/1980 | Dietze et al. |
| 4,566,839 | A | * | 1/1986 | Butler ............... H01L 21/67313 211/41.18 |
| 4,993,559 | A | | 2/1991 | Cota |
| 5,595,604 | A | | 1/1997 | Kobayashi et al. |
| 6,318,389 | B1 | * | 11/2001 | Schmidt ............ H01L 21/67316 134/201 |
| 8,776,602 | B2 | * | 7/2014 | Nakatani ............... G01P 1/023 73/514.33 |
| 2003/0106575 | A1 | * | 6/2003 | Moon ............... H01L 21/67313 134/201 |
| 2016/0315003 | A1 | * | 10/2016 | Reichart ........... H01L 21/67313 |
| 2016/0322253 | A1 | * | 11/2016 | Yen ................... H01L 21/67313 |
| 2020/0010206 | A1 | * | 1/2020 | Desjoyeaux ............ C04B 35/80 |

FOREIGN PATENT DOCUMENTS

| | | |
|---|---|---|
| JP | 05-095040 A | 4/1993 |
| JP | H08-102486 A | 4/1996 |
| JP | H09-275078 A | 10/1997 |
| JP | H11-71181 A | 3/1999 |
| JP | 2000-119079 A | 4/2000 |
| JP | 2008-010589 A | 1/2008 |
| JP | 2019-004096 A | 1/2019 |

* cited by examiner

WAFER BOAT

TECHNICAL FIELD

The present disclosure relates to a wafer boat.

BACKGROUND ART

To date, a manufacturing process for semiconductor devices such as LSIs includes a process of performing thermal treatment on a semiconductor wafer (hereinafter, simply referred to as a "wafer" in some cases), at a high temperature of approximately 1200° C., for forming an oxide film on a surface of the wafer or diffusing a dopant. In such a thermal treatment process, a wafer boat as described in Patent Document 1 is used in order to place a plurality of wafers at predetermined intervals in a horizontal direction.

CITATION LIST

Patent Literature

Patent Document 1: JP 11-126755 A

SUMMARY OF INVENTION

A wafer boat according to the present disclosure includes a plurality of support columns, each having a pillar shape and comprising a plurality of grooves configured to have a wafer placed thereon, and support plates configured to support both end portions of the plurality of support columns, respectively. Each of the plurality of support columns are formed of a ceramic containing aluminum oxide or silicon carbide as a main constituent, and an outer side surface of the plurality of support column is a ground surface and/or a polished surface.

DESCRIPTION OF EMBODIMENTS

A known wafer boat as described in Patent Document 1 may cause waviness or warpage of a support rod (support column) due to a manufacturing method or the like. As a result, the known wafer boat cannot accurately maintain the straightness of the outer peripheral surface of the support rod in an axial direction, the squareness of the outer peripheral surface with respect to an end surface of the support rod, and the like. Thus, it is difficult to accurately form a groove for placing a wafer.

In the wafer boat according to the present disclosure, as described above, the outer side surface of the support column is a ground surface and/or a polished surface. This improves the straightness of the support column in the axial direction and the squareness of the outer side surface with respect to an end surface of the support column, compared with a case where the outer side surface is a surface as-fired. As a result, the squareness of a virtual center surface of a groove with respect to the outer side surface and the parallelism between virtual center surfaces of grooves adjacent to each other are improved. Thus, by using the wafer boat according to the present disclosure, a plurality of wafers can be placed on the wafer boat in a regularly aligned state.

Figure 1:
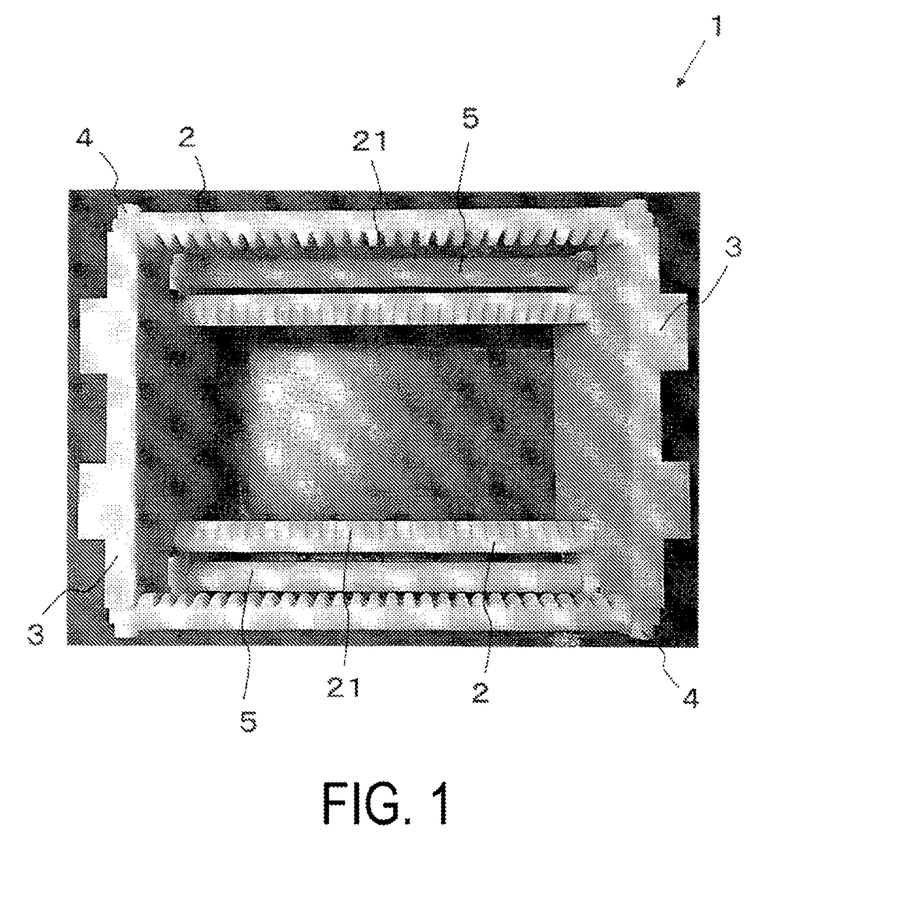
FIG. 1 is a photograph showing a wafer boat according to an embodiment of the present disclosure.
Figure 2:
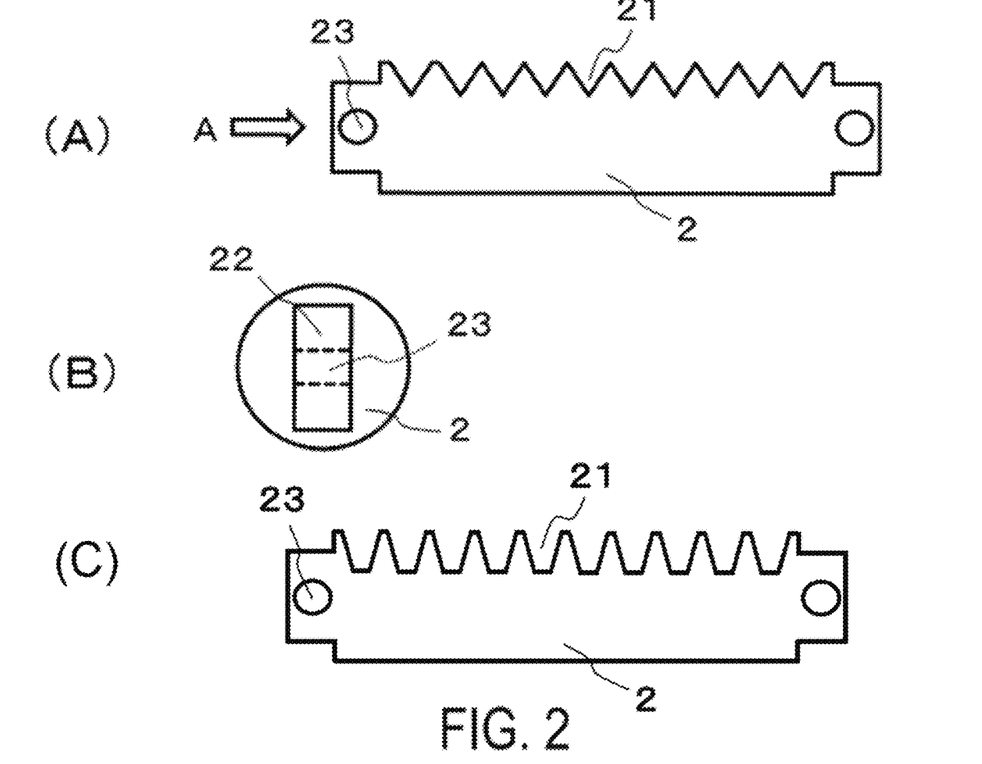
FIG. 2(A) is an explanatory diagram illustrating a support column supported by the wafer boat according to the embodiment.
FIG. 2(B) is an explanatory diagram of the support column illustrated in FIG. 2(A) in a view from the direction of an arrow A.
FIG. 2(C) is an explanatory diagram illustrating a support column supported by the wafer boat according to an alternative embodiment.

The wafer boat according to the embodiment of the present disclosure will be described with reference to FIGS. 1 to 6. The wafer boat 1 according to the embodiment illustrated in FIG. 1 includes support columns 2 having a columnar shape and support plates 3. The wafer boat 1 according to the embodiment is provided with, as illustrated in FIG. 1, rod-shaped members 5 that are different from the support columns 2. None of the rod-shaped members 5 is formed with a groove 21 as provided at the support column 2, and each is used as a so-called reinforcing member.

Figure 5:
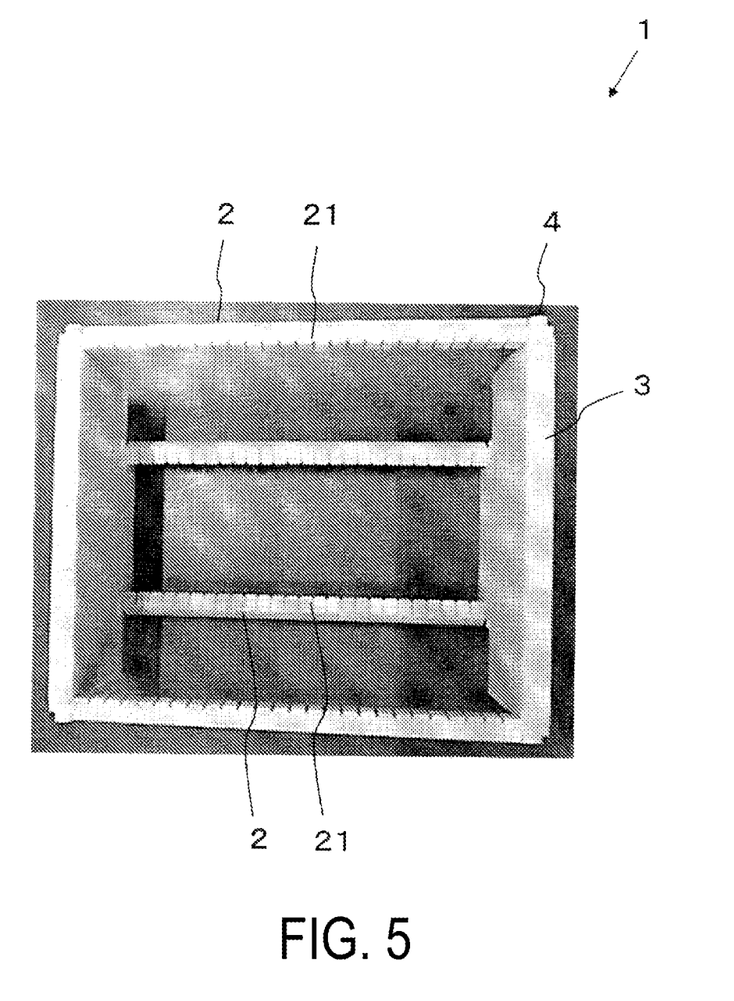
FIG. 5 is a photograph showing a wafer boat according to another embodiment of the present disclosure.
Figure 6:
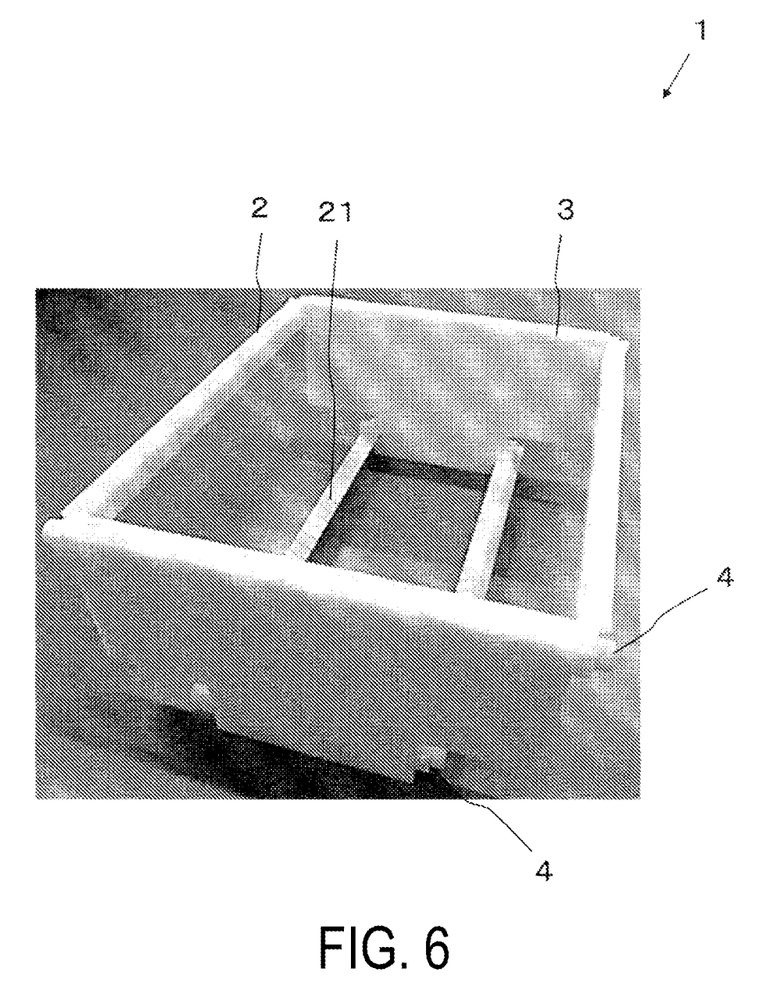
FIG. 6 is a photograph of the wafer boat illustrated in FIG. 5 taken from an oblique direction.

The wafer boat 1 according to the embodiment illustrated in FIGS. 5 and 6 includes the support columns 2 having a prism shape and the support plates 3. The wafer boat 1 illustrated in FIGS. 5 and 6 can be made lighter because the rod-shaped member 5 is not provided and the support column 2 also functions as a reinforcing member.

The support column 2 illustrated in FIGS. 1 and 5 includes a plurality of grooves 21 for placing wafers. The size of the support column 2 is not limited, and is appropriately designed depending on the number and size of wafers to be placed thereon. For example, the support column 2 has a length (total length) equal to or longer than about 120 mm and equal to or shorter than about 180 mm. The support column 2 having a columnar shape may have a thickness (diameter) equal to or larger than about 8 mm and equal to or smaller than about 12 mm. The support column 2 having a prism shape has a square cross-sectional shape in a direction perpendicular to the axis, and a length of one side may be equal to or longer than about 4 mm and equal to or shorter than about 12 mm.

Only the support columns 2 having a columnar shape are illustrated in FIG. 1, and only the support columns 2 having a prism shape are illustrated in FIG. 5. However, the wafer boat 1 may include both of the support columns 2 having a columnar shape and the support columns 2 having a prism shape.

The support columns 2 are formed of a ceramic having aluminum oxide or silicon carbide as a main constituent. The support columns 2 are not limited to a ceramic having aluminum oxide or silicon carbide as a main constituent. In the present specification, the "main constituent" means a constituent that accounts for 80 mass % or more among the total of 100 mass % of the constituents constituting the ceramic. The identification of each constituent contained in the ceramic is performed with an X-ray diffractometer using a CuKα beam, and the content of each constituent is determined, for example, with an inductively coupled plasma (ICP) emission spectrophotometer or a fluorescence X-ray spectrometer.

When the ceramic contains aluminum oxide as a main constituent, the ceramic may contain magnesium, silicon, and calcium as oxides. In terms of oxides, for example, the magnesium content is equal to or larger than 0.034 mass % and equal to or smaller than 0.36 mass %, the silicon content is equal to or larger than 0.02 mass % and equal to or smaller than 0.7 mass %, and the calcium content is equal to or larger than 0.011 mass % and equal to or smaller than 0.065 mass %.

The depth, width, and number of the grooves 21 for placing wafers are not limited. The depth, width, and number of the grooves 21 are appropriately designed depending on the number and size of the wafers to be placed.

The cross-sectional shape of the grooves 21 may be an isosceles trapezoidal shape with an opening side having a wider width than the placement surface side. With such a shape, when a wafer is inserted into the grooves 21 and placed, it is possible to reduce the likelihood of the wafer making contact with the inner side surfaces forming the grooves 21. The apex angle of the groove in cross-sectional view is, for example, equal to or larger than 18° and equal to or smaller than 42°, and is particularly equal to or larger than 20° and equal to or smaller than 40°.

In the wafer boat 1 according to the embodiment, the outer side surface of each of the support columns 2 is a ground surface and/or a polished surface. When the outer side surface of the support column 2 includes a surface processed in this manner, the straightness of the outer side surface in the axial direction or the squareness of the outer side surface with respect to the end surface of the support column 2 is improved compared with the case where the outer side surface is a surface as-fired (unground surface and unpolished surface). Thus, the squareness of the virtual center surface of the groove 21 with respect to the outer peripheral surface and the parallelism between the virtual center surfaces of the grooves 21 adjacent to each other are improved. As a result, a plurality of wafers can be regularly aligned.

Grinding or polishing is carried out, for example, by surface grinding, centerless grinding, brush polishing, buff polishing, and the like.

In each of the grooves 21 provided at the support columns 2, the placement surface on which a wafer is placed may be a ground surface and/or a polished surface. In this case, it is preferable that an arithmetic mean roughness Ra of the placement surface on which the wafer is placed be smaller than an arithmetic mean roughness Ra of the outer side surface. When the grooves 21 provided at the support column 2 have such a structure, it is possible to reduce the likelihood of damage to a wafer when the wafer is placed on the grooves 21.

In the grooves 21 provided at the support columns 2, the arithmetic mean roughness Ra of the placement surface on which a wafer is placed is not limited. For example, the arithmetic mean roughness Ra of the placement surface on which a wafer is placed is preferably equal to or larger than about 0.02 μm and equal to or smaller than about 0.3 μm. Furthermore, as long as the arithmetic mean roughness Ra of the placement surface on which the wafer is placed is smaller than the arithmetic mean roughness Ra of the outer side surface, a difference therebetween is not limited. For example, the difference between the arithmetic mean roughness Ra of the placement surface on which the wafer is placed and the arithmetic mean roughness Ra of the outer side surface may be equal to or larger than 0.05 μm. In a case where the arithmetic mean roughness Ra of the placement surface on which the wafer is placed is equal to or larger than about 0.02 μm and equal to or smaller than about 0.3 μm, and the difference between the arithmetic mean roughness Ra of the placement surface on which the wafer is placed and the arithmetic mean roughness Ra of the outer side surface is equal to or larger than 0.05 μm, the likelihood of damage to the wafer can be further reduced when the wafer is placed on the grooves 21.

Both of the arithmetic mean roughness Ra of the placement surface on which the wafer is placed and the arithmetic mean roughness Ra of the outer side surface can be measured by using a laser microscope (manufactured by KEYENCE CORPORATION, VK-X1100 or successor models thereof) having a measurement mode conforming to JIS B 0601:2001. As the measurement conditions, first, a magnification is set to 480 times, a cutoff value λs is not set, a cutoff value λc is set to 0.08 mm, a cutoff value λf is not set, and a measurement range for one point from each of the placement surface and the outer side surface that are to be measured is set to 705 μm×530 μm. Here, in the setting of the measurement range, a representative part indicating the features of the surface, of the surface observed with the magnification set to 480 times, can be selected.

Further, the surface roughness can be measured by drawing four lines to be measured at substantially equal intervals in the measurement range to obtain an average value of the arithmetic mean roughness Ra for each surface, and then, both can be compared. A length per one line is 560 m, and the direction of the line may be the same direction as a direction of a grinding line or a polishing line observed on the placement surface and the outer side surface.

Each of both end portions of the support column 2 includes an engaging portion 22 having a flat plate shape as illustrated in FIG. 2(B). A through hole 23 in which a male screw 4 is to be inserted in the thickness direction is formed at the engaging portion 22 having the flat plate shape. That is, the through hole 23 is formed in a direction perpendicular to the axial direction (longitudinal direction) of the support column 2. The through hole 23 is formed in the same axial center as that of a female screw (not illustrated) provided at the support plate 3, and the male screw 4 is inserted into the through hole 23 and attached to the support plate 3.

The manufacturing method for each of the support columns 2 is not limited, and the support column 2 is manufactured, for example, as follows. First, a case will be described where a support column is formed by using a ceramic containing aluminum oxide as a main constituent. An aluminum oxide powder (of a purity equal to or larger than 99.9 mass %) serving as the main constituent and each powder of magnesium hydroxide, silicon oxide, and calcium carbonate are fed into a grinding mill together with a solvent (ion exchange water). After grinding is performed until an average particle diameter (D50) of the powder becomes equal to or less than 1.5 μm, an organic binder and a dispersing agent that disperses the aluminum oxide powder are added and mixed to obtain a slurry.

Here, of the total of 100 mass % of the powder described above, the content of magnesium hydroxide powder falls in a range equal to or larger than 0.05 mass % and equal to or smaller than 0.53 mass %; the content of silicon oxide powder falls in a range equal to or larger than 0.02 mass % and equal to or smaller than 0.7 mass %; the content of calcium carbonate powder falls in a range equal to or larger than 0.02 mass % and equal to or smaller than 0.12 mass %; and the remainder includes aluminum oxide powder and inevitable impurities. Examples of the organic binder include acrylic emulsions, polyvinyl alcohol, polyethylene glycol, polyethylene oxide, and the like.

The slurry is then spray-granulated to obtain granules containing aluminum oxide as a main constituent. A space for molding in a cold isostatic pressing device is filled with the granules, and a powder compact having a columnar shape or a prism shape is obtained by applying a pressure, with the molding pressure set to be, for example, 78 MPa to 128 MPa. Next, after the engaging portion having the flat plate shape and including the through hole is formed at both end portions of the powder compact by cutting or the like, the powder compact is fired in an atmosphere at a firing temperature equal to or higher than 1500° C. and equal to or lower than 1700° C. for a holding time equal to or longer than 4 hours and equal to or shorter than 6 hours to obtain a sintered compact having a pillar shape.

A case in which the support column is made of a ceramic containing, as a main constituent, silicon carbide will be described. A coarse-grained powder and a fine-grained powder are prepared as a silicon carbide powder, and the silicon carbide powder is fed into a grinding mill together with a solvent and a dispersing agent, and ground and mixed to obtain a slurry. The time period for grinding and mixing is equal to or longer than 40 hours and equal to or shorter than 60 hours. The particle size of the fine-grained powder and the particle size of the coarse-grained powder after being ground and mixed are equal to or larger than 0.4 µm and equal to or smaller than 4 µm, and equal to or larger than 11 µm and equal to or smaller than 34 µm, respectively.

Next, the obtained slurry is added and mixed with a sintering aid made of a boron carbide powder and a carbon powder being in an amorphous state or a phenol resin, and a binder, and then, spray drying is performed to obtain granules whose main constituent is silicon carbide. By cutting the powder compact obtained by compacting the granules by the method described above, or the like, an engaging portion including a through hole and having a flat plate shape is formed at both end portions of the powder compact. After that, a degreased compact is obtained in a nitrogen atmosphere at a temperature of from 450° C. to 650° C. for a holding time equal to or longer than 2 hours and equal to or shorter than 10 hours. Next, the degreased compact is fired in a firing atmosphere being a pressure-reduced atmosphere of an inert gas at a firing temperature equal to or higher than 1800° C. and equal to or lower than 2200° C. for a holding time equal to or longer than 3 hours and equal to or shorter than 6 hours to obtain a sintered compact having a pillar shape.

The outer side surface of the above-described sintered compact having the pillar shape is processed by centerless grinding with a rotary grindstone, brush polishing, buff polishing, or the like, and thus, a support column having a columnar shape can be formed. When the sintered compact has a prism shape, machining the outer side surface by surface grinding forms a support column having a prism shape. A groove is formed by V-groove grinding with a rotary grindstone having an outer peripheral tip formed in an acute angle state. As necessary, brush polishing, buff polishing, or the like may be performed. In a case where a wafer boat in which an arithmetic mean roughness Ra of the placement surface is smaller than that of the outer side surface is obtained, for example, a particle size of a rotary grindstone to be used in the formation of the groove can be smaller than a particle size of a rotary grindstone to be used in the formation of the outer side surface.

The male screw 4 is engaged with the female screw provided at the support plate 3 through the through hole 23 formed in the engaging portion 22 having the flat plate shape. Since the support column 2 is in a state of being mechanically attached to the support plate 3 with the screw, a wafer is less likely to become in an unstable state even when the wafer is transported. As a result, the likelihood of damage to the wafer can be reduced.

The support plates 3 are used for supporting (fixing) both end portions of the support columns 2. The size of each of the support plates 3 is appropriately designed depending on the size of a wafer to be placed, the length of the support columns 2, and the like. The support plate 3 is formed of, for example, a ceramic. Examples of the ceramic include a ceramic containing aluminum oxide or silicon carbide as a main constituent. For the purpose of weight reduction, at least one of the support plates 3 may have a hollow structure. Having the hollow structure improves the convection of a washing solution when used as a component for washing. Furthermore, since residual solution is reduced, the washing efficiency is improved.

Figure 3:
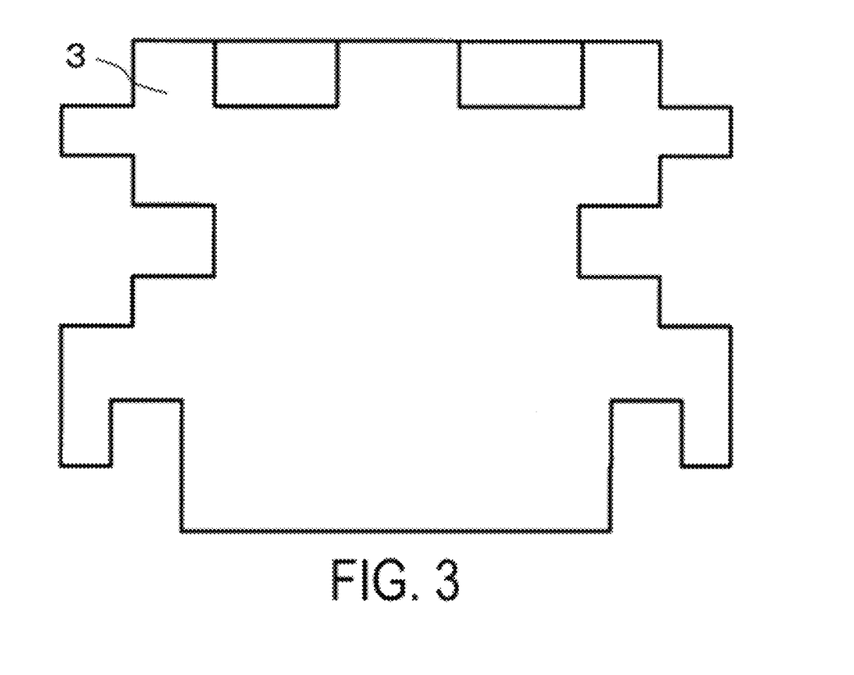
FIG. 3 is an explanatory diagram illustrating the support plate supported by the wafer boat according to the embodiment.
Figure 4:
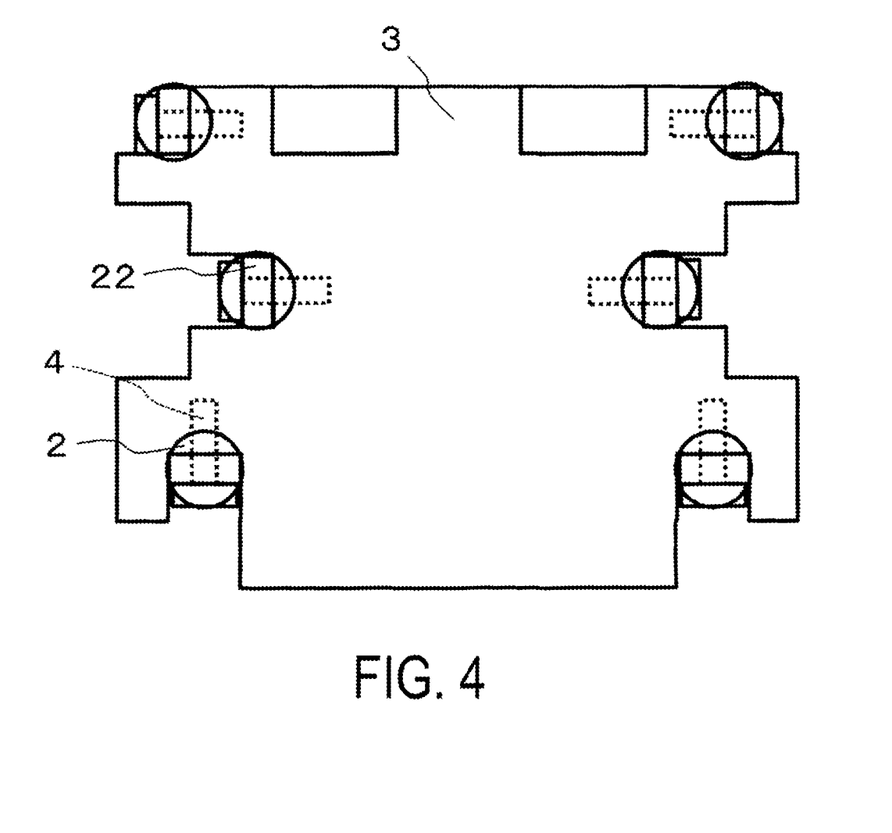
FIG. 4 is an explanatory diagram illustrating a state in which the support column is fixed to the support plate.

As long as the support plate 3 has a shape capable of supporting both end portions of the support columns 2, the shape of the support plate 3 is not limited. For example, as illustrated in FIG. 3, the peripheral edge portion of the support plate 3 may be formed in a recessed and protruding shape so as to match the shape of each of both end portions of the support columns 2. The support columns 2 are disposed so as to position each of both end portions of the support columns 2 at a recessed-protruding portion as illustrated in FIG. 4, and are fixed with the male screw 4 as described above, for example. The male screw 4 is also formed of, for example, a ceramic. Examples of the ceramic include a ceramic containing aluminum oxide or silicon carbide as a main constituent.

The manufacturing method of the support plate 3 is not limited, and the support plate 3 is manufactured, for example, as follows. First, the granules obtained by the method described above are filled into a space for molding in a cold isostatic pressing device. A powder compact having a plate shape can be obtained by applying a pressure, with the molding pressure set to be, for example, equal to or higher than 78 MPa and equal to or lower than 128 MPa. Next, the powder compact is formed to be a precursor of the support plate 3 by cutting or the like. Thereafter, firing conditions can be appropriately selected according to the main constituent, and the sintered compact can be obtained by firing the precursor. Each surface of the sintered compact may be ground or polished as necessary.

The support columns 2, the support plates 3, and the male screws 4 may be formed of ceramics containing different main constituents from one another, or may be formed of ceramics containing main constituents identical to one another. The ceramics containing main constituents identical to one another do not need to have an identical content of the main constituent, and the respective contents of the main constituent may be different. For example, as long as the main constituent is aluminum oxide, the contents of the aluminum oxide may be different.

When the support columns 2, the support plates 3, and the male screws 4 are formed of ceramics containing an identical main constituent, proportions of the main constituent contained in respective members are not limited. For example, as for the content of the main constituent, the content of the main constituent of the male screw 4 is preferably the smallest amount. For example, when the wafer boat 1 according to the embodiment is washed, the support column 2 and the support plate 3 having a larger surface area than that of the male screw 4 have a large area in contact with a washing solution. Thus, it is possible to suppress corrosion even when washing is performed with an acid or alkali by increasing the contents of the main constituents of the support column 2 and the support plate 3 (by increasing the purity). As a result, the wafer boat 1 according to the embodiment can be used for a long period of time.

The content of the main constituent is not limited as long as the content of the main constituent of the male screw 4 is the smallest amount. For example, a difference between the main constituent contained in the support column 2 and the main constituent contained in the male screw 4 may be equal to or larger than 0.15 mass %. By having such a difference, corrosion can be further suppressed and the wafer boat can be used over a longer period of time.

Surfaces of a complete thread portion of the male screw 4 and a complete thread portion of the female screw provided at the support plate 3, and/or an inner wall surface of the through hole 23 formed at the engaging portion 22 that has the flat plate shape and that is provided at each of both end portions of the support column 2 may be a surface as-fired. The wafer boat 1 according to the embodiment can be efficiently washed even in a state where the male screw 4 is engaged with the female screw, because the surface as-fired has a low contact angle with respect to pure water, and the hydrophilicity becomes high. In particular, it is preferable that the surfaces of the complete thread portion of the male screw 4 and the complete thread portion of the female screw provided at the support plate 3 be surfaces as-fired. Since the surfaces of the complete thread portions have large recesses and protrusions, the bonding force is strong, and the reliability with respect to impact resistance and vibration resistance is improved.

At least one of the plurality of support column 2, the support plates 3, and the male screw 4 may be formed of a ceramic including closed pores. In this case, the ceramic includes closed pores, and a value (A) obtained by subtracting an average value of equivalent circle diameters of the closed pores from a distance between the centroids of adjacent closed pores may be equal to or larger than 20 μm and equal to or smaller than 85 μm. When the value (A) is equal to or larger than 20 μm, gap portions are dispersed and disposed so as not to be densely packed in the ceramic. Thus, a higher mechanical characteristic is exhibited. On the other hand, when the value (A) is equal to or smaller than 85 μm, workability such as polishing is further improved. Furthermore, when the value (A) is within such a range, an interval between adjacent closed pores becomes narrower. Thus, the development of microcracks caused by thermal shock or the like can be suppressed.

The value (A) can be obtained by the following method. First, polishing is performed from the cross section perpendicular to the longitudinal direction of the support column 2 in a depth direction (longitudinal direction) with a copper disc by using diamond abrasive grains having an average grain diameter $D_{50}$ of 3 μm. Thereafter, polishing is performed with a tin disc by using diamond abrasive grains having an average grain diameter $D_{50}$ of 0.5 μm to obtain a polished surface.

The polished surface is observed at a magnification of 200 times, and an average range is selected, and for example, a range with an area of 0.105 mm² (a horizontal length is 374 μm and a vertical length is 280 μm) is captured by a CCD camera to obtain an observation image. For this observation image, the distance between the centroids of the closed pores is preferably obtained by a method called the inter-centroid distance method for measuring the degree of dispersion by using the image analysis software "Azo-kun (ver. 2.52)" (registered trade name, manufactured by Asahi Kasei Engineering Corporation). Hereinafter, the term image analysis software "Azo-kun" refers to the image analysis software manufactured by Asahi Kasei Engineering Corporation throughout the description.

As setting conditions of this method, for example, a threshold value, which is an indicator indicating the lightness and darkness of an image, may be set to 86, a brightness may be set to dark, a small figure removal area may be set to 1 μm², and a noise removal filter may be set to be present. The threshold value may be adjusted according to the brightness of the observation image. After the brightness is set to dark, a binarization method is set to manual, the small figure removal area is set to 1 μm², and the noise removal filter is set to be present, the threshold value is preferably adjusted in such a manner that a marker appearing in the observation image matches the shape of a pore.

The equivalent circle diameters of closed pores can be obtained by the following method. For the observation image described above, the equivalent circle diameters of the closed pores may be determined by a method of particle analysis. The setting conditions of this method may also be set to be the same as the setting conditions used by the inter-centroid distance method of measuring the degree of dispersion.

In a case of the support plate 3, a polished surface is manufactured in the same manner as the method described above in the thickness direction of the support plate 3, and the value (A) may be determined in the same manner as the method described above for the polished surface. In a case of the male screw 4, the polished surface is manufactured in the same manner as the method described above in the depth direction (longitudinal direction) from a cross section perpendicular to the longitudinal direction of the male screw 4, and the value (A) may be determined in the same manner as the method described above for the polished surface.

In order to obtain the support column 2, the support plate 3, and the male screw 4 whose value (A) is equal to or larger than 20 μm and equal to or smaller than 85 μm, when a ceramic containing aluminum oxide as the main constituent is obtained, a powder compact is fired in a firing atmosphere of air atmosphere at a firing temperature equal to or higher than 1500° C. and equal to or lower than 1600° C. for a holding time equal to or longer than 5 hours and equal to or shorter than 6 hours, and then, for example, the thermal treatment may be performed at a thermal treatment temperature equal to or higher than 1300° C. and equal to or lower than 1600° C. in a thermal treatment atmosphere of an argon atmosphere at a pressure equal to or higher than 90 MPa and equal to or lower than 300 MPa.

The wafer boat 1 according to the embodiment can have a plurality of wafers placed in a regularly aligning state as described above. Such a wafer boat 1 according to the embodiment is provided in a thermal treatment apparatus for performing thermal treatment on a wafer, a washing apparatus for washing the wafer, and the like.

The wafer boat according to the present disclosure is not limited to the embodiments described above. For example, the wafer boat 1 according to the embodiment is provided with four support columns 2. However, it is sufficient that at least two support columns having a pillar shape be provided in the wafer boat according to the present disclosure as long as the support columns are disposed to be capable of holding the wafer.

In the wafer boat 1 according to the embodiment, the support column 2 is supported by the support plate 3 by using the male screw 4. However, in the wafer boat according to the present disclosure, a means for supporting the support columns having a pillar shape by using the support plate is not limited, and the support columns may be supported by, using, for example, an adhesive, glass bonding, diffusion bonding, or the like.

In the wafer boat 1 according to the embodiment, the peripheral edge portion of the support plate 3 is formed in a recessed and protruding shape so as to match the shape of each of both end portions of the support column 2. However, in the wafer boat according to the present disclosure, the shape of the support plate is not limited, and the peripheral edge portion of the support plate does not need to be formed in a recessed and protruding shape.

The wafer boat 1 according to the embodiment is provided with the rod-shaped member 5 that is different from the support column 2 as a reinforcing member. However, in the wafer boat according to the present disclosure, such a rod-shaped member is a member optionally used, and is not a member necessarily used.

REFERENCE SIGNS LIST

1 Wafer boat
2 Support column
21 Groove
22 Engaging portion having flat plate shape
23 Through hole
3 Support plate
4 Male screw
5 Rod-shaped member

The invention claimed is:

1. A wafer boat comprising:
a plurality of support columns, each having a pillar shape and comprising a plurality of grooves configured to have a wafer placed thereon; and
support plates configured to support both end portions of the plurality of support columns respectively, wherein
each of the plurality of support columns are formed of a ceramic comprising aluminum oxide or silicon carbide as a main constituent, and
an outer side surface of the plurality of support columns is a ground surface and/or a polished surface, wherein
each of both end portions of the plurality of support columns comprises an engaging portion having a flat plate shape and comprising a through hole in a thickness direction,
the support plates are provided with a female screw at an axial center of each through hole, and
a male screw is engaged with the female screw through the through hole.

2. The wafer boat according to claim 1, wherein
a placement surface on which the wafer is placed in the plurality of grooves is the ground surface and/or the polished surface, and
an arithmetic mean roughness Ra of the placement surface is smaller than an arithmetic mean roughness Ra of the outer side surface.

3. The wafer boat according to claim 1, wherein
a cross-sectional shape of the plurality of grooves is an isosceles trapezoidal shape whose opening side has a wider width than the placement surface side.

4. The wafer boat according to claim 1, wherein
each of the plurality of support columns, the support plates, and the male screws is formed of a ceramic comprising an identical main constituent, and
the amount of the main constituent in one male screw is smaller than the amount of the main constituent in one support column and smaller than the amount of the main constituent in one support plate.

5. The wafer boat according to claim 4, wherein
a content of the main constituent comprised in the plurality of support columns is at least 0.15 mass % larger than a content of the main constituent comprised in the male screw.

6. The wafer boat according to claim 1, wherein
at least one of a surface of a complete thread portion of the female screw and a surface of a complete thread portion of the male screw, and an inner wall surface of the through hole is an unground surface and an unpolished surface.

7. The wafer boat according to claim 1, wherein
the through hole is a long hole along an axial direction of the plurality of support columns.

8. The wafer boat according to claim 1, wherein
at least one of the plurality of support columns, the support plates, or the male screw is formed of a ceramic comprising closed pores, and
a value (A) obtained by subtracting an average value of equivalent circle diameters of the closed pores from a distance between centroids of adjacent closed pores is equal to or larger than 20 μm and equal to or smaller than 85 μm.

9. The wafer boat according to claim 1, wherein
at least one of the support plates comprises a hollow structure.

10. A thermal treatment apparatus comprising:
the wafer boat according to claim 1.

11. A washing apparatus comprising:
the wafer boat according to claim 1.

* * * * *